(12) United States Patent
Park et al.

(10) Patent No.: US 7,622,316 B2
(45) Date of Patent: Nov. 24, 2009

(54) ACTIVE MATRIX ORGANIC LUMINESCENCE DISPLAY DEVICE AND MANUFACTURING METHOD FOR THE SAME

(75) Inventors: Jae-Yong Park, Anyang-si (KR); Juhn Suk Yoo, Icheon-kwangyokshi (KR)

(73) Assignee: LG. Display Co., Ltd., Seoul (KR)

( * ) Notice: Subject to any disclaimer, the term of this patent is extended or adjusted under 35 U.S.C. 154(b) by 93 days.

(21) Appl. No.: 11/789,503

(22) Filed: Apr. 25, 2007

(65) Prior Publication Data

US 2007/0202625 A1 Aug. 30, 2007

Related U.S. Application Data

(62) Division of application No. 10/330,918, filed on Dec. 27, 2002, now Pat. No. 7,227,184.

(30) Foreign Application Priority Data

Dec. 29, 2001 (KR) ............................... 2001-88537

(51) Int. Cl.
*H01L 21/00* (2006.01)
(52) U.S. Cl. .................. 438/34; 438/149; 438/E21.413
(58) Field of Classification Search .................. 257/72, 257/66, 350, 69, E21.413; 438/44, 48, 128, 438/149, 151, 157, 283; 315/169.3
See application file for complete search history.

(56) References Cited

U.S. PATENT DOCUMENTS

| | | | |
|---|---|---|---|
| 5,684,365 A | * | 11/1997 | Tang et al. ............... 315/169.3 |
| 6,501,466 B1 | | 12/2002 | Yamagishi et al. |
| 6,548,867 B2 | | 4/2003 | Yamada et al. |
| 6,618,029 B1 | * | 9/2003 | Ozawa ........................ 345/82 |
| 6,653,657 B2 | * | 11/2003 | Kawasaki et al. ............. 257/69 |
| 6,680,487 B1 | * | 1/2004 | Kokubo et al. ................ 257/66 |
| 6,690,033 B2 | | 2/2004 | Yamazaki et al. |
| 2003/0038306 A1 | | 2/2003 | Izumi et al. |

* cited by examiner

*Primary Examiner*—Sue Purvis
*Assistant Examiner*—Selim Ahmed
(74) *Attorney, Agent, or Firm*—Brinks Hofer Gilson & Lione

(57) ABSTRACT

An active matrix organic electro luminescent display (ELD) device comprises a substrate, first and second active layers formed of polycrystalline silicon on the substrate, first source and drain regions and second source and drain regions, the first source and drain regions neighboring the first active layer and the second source and drain regions neighboring the second active layer, a gate insulating layer on the first and second active layers, first and second gate electrodes on the gate insulating layer, a first inter layer on the first and second gate electrodes, an anode electrode and a capacitor electrode on the first inter layer, a first passivation layer on the anode electrode and the capacitor electrode, a power line on the first passivation layer, first source and drain electrodes on the first passivation layer, the first source electrode being connected to the first source region and the first drain electrode being connected to the first drain region, second source and drain electrodes on the first passivation layer, the second source electrode being connected to the second source region, the power line and the capacitor electrode and the second drain electrode being connected to the second drain region and the anode electrode, and a second passivation layer on the first source and drain electrodes and the second source and drain electrodes, the second passivation layer having a bank that exposes the anode electrode.

15 Claims, 13 Drawing Sheets

ACTIVE MATRIX ORGANIC LUMINESCENCE DISPLAY DEVICE AND MANUFACTURING METHOD FOR THE SAME

CROSS REFERENCE TO RELATED APPLICATION

This application is a divisional application of U.S. application Ser. No. 10/330,918, filed on Dec. 27, 2002 now U.S. Pat. No. 7,227,184, which claims the benefit of priority to Korean patent application No. 2001-88537, filed on Dec. 29, 2001, both of which are incorporated herein by reference.

This application claims the benefit of Korean Patent Application No. 2001-88537, filed on Dec. 29, 2001 in Korea, which is hereby incorporated by reference for all purposes as if fully set forth herein.

BACKGROUND THE INVENTION

1. Field of the Invention

The present invention relates to a flat panel display device and more particularly, to an active matrix electro luminescence display (ELD) device having thin film transistors and manufacturing method for the same.

2. Discussion of the Related Art

As the information age has been evolved rapidly, the necessity for flat panel display, which has advantages such as thinness, lightweight and lower power consumption, has been increased. Accordingly, various flat panel display devices such as liquid crystal display (LCD) devices, plasma display panels (PDPs), field emission display devices and electro luminescence display (ELD) devices have been researched. The electro luminescence display (ELD) device makes use of electro luminescence phenomenon in which light is generated when an electric field of certain intensity is applied to a fluorescent substance. The electro luminescence display (ELD) devices can be classified into inorganic electro luminescence display (ELD) devices and organic electro luminescent display (ELD) devices depending on the source that excites careers. Attention recently has focused on the organic electro luminescent display (ELD) device as a displaying device for natural colors because it can display every colors in the visible range and has a high brightness and a low action voltage. In addition, because the organic electro luminescence display (ELD) device is self-luminescent, it has a high contrast ratio and is suitable for an ultra-thin type display device. Moreover, because it has a simple manufacturing process, the degree of environmental contamination is relatively low. Besides, the organic electro luminescence display (ELD) device has a few microseconds (ps) response time so that it is suitable for displaying moving images. The organic electro luminescence display (ELD) device has no limit in a viewing angle and is stable in low temperature conditions. Because it is driven with a relatively low voltage between 5V and 15V, manufacturing and design of a driving circuit is easy. A structure of the organic electro luminescent display (ELD) device is similar to that of the inorganic electro luminescence display (ELD) device but the light-emitting theory is different from that of the inorganic electro luminescence display (ELD) device. That is, the organic electro luminescence display (ELD) device emits light by recombination of an electron and a hole and thus it is referred to as an organic light emitting diode (OLED). Recently, an active matrix type display in which a plurality of pixels is arranged in a matrix form and a thin film transistor is connected thereto has been widely applied to the flat panel display devices. The active matrix type display is also applied to the organic electro luminescent display (ELD) device and this is transferred to as an active matrix organic electro luminescent display (ELD) device.

FIG. 1 is a circuit diagram illustrating a pixel of a related art active matrix organic electro luminescent display device. In FIG. 1, a pixel of the active matrix organic electro luminescent display device has a switching thin film transistor 4, a driving thin film transistor 5, a storage capacitor 6 and a light emitting diode (LED) 7. The switching thin film transistor 4 and the driving thin film transistor 5 are formed of p type polycrystalline silicon thin film transistor. A gate electrode of the switching thin film transistor 4 is connected to the gate lane 1 and a source electrode is connected to the data line 2. A drain electrode of the switching thin film transistor 4 is connected to a gate electrode of the driving thin, film transistor 5 and a drain electrode of the driving thin film transistor 5 is connected to an anode electrode of the light emitting diode (LED) 7. A source electrode of the driving thin film transistor 5 is connected to a power line 3 and a cathode electrode of the light emitting diode (LED) 7 is grounded to earth. A storage capacitor 6 is connected to the gate electrode and the source electrode of the driving thin film resistor 5. If a signal is applied to the gate line 1, the switching thin film transistor 4 is turned on. If a signal of the data line 2 is applied to the gate electrode of the driving thin film transistor 5, the driving thin film transistor 5 is turned on and thus the light emitting diode (LED) 7 emits light. The storage capacitor 6 serves to keep a gate voltage of the driving thin film transistor 5 constant while the switching thin film transistor 4 is turned off.

FIG. 2 is a cross-sectional view of the related art active matrix organic electro luminescent display device. In FIG. 2, a polycrystalline silicon layer 11, 12, 13, 14, 15 and 16 having an island shape is formed on a substrate 10. The polycrystalline silicon layer 11, 12, 13, 14, 15 and 16 is divided into an active layer 111 and 14 of the thin film transistor and source and drain regions 12, 13, 15 and 16 on which impurities doped. A gate insulating layer 20 is formed on the polycrystalline silicon layer 11, 12, 13, 14, 15 and 16. First and second gate electrodes 21 and 22 are formed on the gate insulating layer 20 over the active layer 11 and 14. An inter layer 30 is then formed on the first and second gate electrodes 21 and 22. The inter layer 30 and the gate insulating layer 20 has first, second and third contact holes 30a, 30b and 30c that respectively exposes a portion of a first source region 12, a second drain region 15 and a second source region 16. A first source electrode 41, a second drain electrode 42 and a second source electrode 43 are formed of conductive metal material on the inter layer 30. The first source electrode 41 is connected to the first source region 12 through the first contact hole 30a, the second drain electrode 42 to the second drain region 15 through the second contact hole 30b and the second source electrode 43 to the second source region 16 through the third contact hole 30c. A first drain electrode (not shown in the figure) is further formed of same material as the first source electrode 41 over the first drain region 13 and connected to the first drain region 13. The first drain electrode (not shown) is also connected to the second gate electrode 22. The second source electrode 43 is connected to the power line 3 of FIG. 3 and it may be extended from the power line 3 of FIG. 1 or be a portion of the power line 3 of FIG. 1. A portion of the second source electrode 43 is overlapped with the second gate electrode 22 and thus forms the storage capacitor $C_{st}$. The first gate electrode 21, the first source electrode 41 and the first drain electrode (not shown) constitutes the switching thin film transistor 4 of FIG. 1 and the second gate electrode 22, the second source electrode 43 and the second drain electrode 42 constitutes the driving thin film transistor 5 of FIG. 1. A first passivation layer 50 is formed on the first source electrode 41, the second drain electrode 42 and the second source electrode 43 and the first passivation layer 50 has a fourth contact hole 50a that exposes a portion of the second drain electrode 42. An anode electrode 60 is formed of transparent conductive material on the first passivation layer 50 and the anode electrode 60 is connected to the second drain electrode 42 through the fourth contact hole 50a. A second passivation layer 70 is then formed on the anode electrode 60 and the second passivation layer 70 has a bank 71 that exposes the anode electrode 60.

FIGS. 3A to 3G are cross-sectional views illustrating a fabricating sequence of the related art active matrix organic electro luminescent display device. In FIG. 3A, a semiconductor layer 17 and 18 are formed by forming a polycrystalline silicon layer and patterning it with a first mask on the substrate 10. A buffer layer (not shown) may further be formed of material such as silicon oxide ($SiO_2$) between the substrate 10 and the semiconductor layer 17 and 18.

In FIG. 3B, the gate insulating layer 20 is formed on the semiconductor layer 17 and 18. The fast and second gate electrodes 21 and 22 are formed by depositing material such as metal and patterning it with a second mask. The active layers 11 and 14 and the source and drain regions 12, 13, 15 and 16 are formed by doping impurities into the semiconductor layer 17 and 18 of FIG. 3A using the first and second gate electrodes 21 and 22 as a mask. The impurities are not doped into the active layer 11 and 14.

In FIG. 3C, the inter layer 30 is formed on the first and second gate electrodes 21 and 22 and the first, second and third contact holes 30a, 30b and 30c are formed by patterning the inter layer 30 with a third mask. The first contact hole 30a exposes the first source region 12, the second contact hole 30b the second drain region 15 and the third contact hole 30c the second source region 16.

In FIG. 3D, the first source electrode 41, the second drain electrode 42 and the second source electrode 43 are formed by depositing conductive material such as metal on the inter layer 30 and patterning it with a fourth mask. The first source electrode 41 is connected to the first source region 12 through the first intact hole 30a, the second drain electrode 42 to the second drain region 15 through the second contact hole 30b and the second source electrode 43 to the second source region 16 through the third contact hole 34c. The second source electrode 43 forms the storage capacitor $C_{st}$ by overlapping with the second gate electrode 22. In addition, the first drain electrode (not shown) and the power line (not shown) are formed at this time. The first drain electrode is connected to the first drain region 13 and the second gate electrode 22, and the power line is connected to the second source electrode 43.

In FIG. 3E, the first passivation layer 50 is formed on the first source electrode 41, the second drain and source electrodes 42 and 43. The fourth contact hole 50a, which exposes a portion of the second drain electrode 42, is formed by patterning the first passivation layer 50 with a fifth mask.

In FIG. 3F, the anode electrode 60, which contacts the second drain electrode 42 through the fourth contact hole 50a, is formed by depositing transparent conductive material on the first passivation layer 50 and patterning it with a sixth mask. The anode electrode 60 becomes a pixel electrode of the active matrix organic electro luminescent display device.

In FIG. 3G, the second passivation layer 70 is formed on the anode electrode 60 and the bank 71 is formed in the second passivation layer 70 by patterning the second passivation layer 70 with a seventh mask. After forming an array substrate of the active matrix organic electro luminescent display device as stated above, the active matrix organic electro luminescent display device is completed by further forming organic luminescent layer over the bank 71 and forming a cathode electrode thereon.

The storage capacitor $C_{st}$ is for keeping a gate driving voltage of the driving thin film transistor stable and is an important element for displaying high quality images by restraining a pixel voltage fluctuation that is induced by a kick-back voltage of the switching thin film transistor and a leakage current. A storage capacitance of the storage capacitor is proportional to an area of electrodes and a dielectric constant of a dielectric substance between two electrodes, and inverse proportional to a distance between the two electrodes, i.e., a thickness of the dielectric substance. The inter layer 30 is usually formed of silicon oxide ($SiO_2$) and its thickness is about 7,000 Å (angstrom). If the thickness of the inter layer 30 is small, the power line becomes winding and thus electric resistance is increased. Besides, the power line may be broken. Accordingly, there is a limit in reducing the thickness of the inter layer 30. If the area of the electrode of the storage capacitor is increased, it results in a decrease of an area of the pixel electrode, i.e., the anode electrode 60, and thus an aperture ratio is decreased. An active matrix organic electro luminescent display device has been suggested to overcome this problem and it is illustrated in FIG. 4. FIG. 4 is a cross-sectional view of other related art active matrix organic electro luminescent display device. Because the active matrix organic electro luminescent display device of FIG. 4 has a similar structure with that of the above mentioned one of FIG. 2 except a storage capacitor portion, a detailed explanation on a same structure will be omitted. In FIG. 4, a first inter layer 31 is formed on the first and second gate electrodes 21 and 22. A capacitor electrode 80 that is overlapped with the second gate electrode 22 is formed on the first inter layer 31. A second inter layer 32 is formed on the capacitor electrode 80. The second inter layer 32 together with the first inter layer 31 and the gate insulating layer 20 has first, second, third and fourth contact holes 32a, 32b, 32c and 32d. The first contact hole 32a exposes a portion of the first source region 12, the second contact hole 32b the second drain region 15, the third contact hole 32c the capacitor electrode 80 and the fourth contact hole 32d the second source region 16. The first source electrode 41, the second drain electrode 42 and the second source electrode 43 are formed on the second inter layer 32. The first source electrode 41 is connected to the first source region 12 through the first contact hole 32a and the second drain electrode 42 is connected to the second drain region 15 through the second contact hole 32b. The second source electrode 43 is connected to the capacitor electrode 80 and the second source region 16 respectively through the third and fourth contact holes 32c and 32d. The first and second inter layers 31 and 32 are usually formed of silicon oxide ($SiO_2$). A thickness of the first inter layer 31 is about 3,000 Å (angstrom) and a thickness of the second inter layer 32 is about 4,000 Å (angstrom). A summation of the thickness of the first inter layer 31 and the thickness of the second inter layer 32 has a similar value with that of the inter layer 30 of FIG. 2. Because the capacitor electrode 80 is formed between the first and second inter layers 31 and 32 and the capacitor electrode 80 and the second gate electrode 22 form the storage capacitor, a thickness of the dielectric substance is reduced and thus the storage capacitance of the storage capacitor can be increased. However, this active matrix organic electro luminescent display device is manufactured by iterating a photolithographic masking process several times. Because the photolithographic masking process includes many minor processes such as cleaning, deposition of the photoresist layer, exposure, development and etching, manufacturing time and cost depends on the number of masks needed. That is, if only one mask can be omitted for the total manufacturing process, the manufacturing time and cost can be greatly saved. The active matrix organic electro luminescent display device of FIG. 2 needs seven masks and the active matrix organic electro luminescent display device needs 8 masks because the capacitor electrode 80 must be formed of separate metal material. Accordingly, the manufacturing time and cost are increased according to the related arts.

SUMMARY OF THE INVENTION

Accordingly, the present invention is directed to an active matrix organic electro luminescent display (ELD) device and manufacturing method for the same that substantially obviates one or more of problems due to limitations and disadvantages of the related art.

An advantage of the present invention is to provide an active matrix organic electro luminescent display (ELD) device in which a storage capacitance of a storage capacitor is increased without reducing an aperture ratio and number of masks needed is reduced.

Another advantage of the present invention is to provide a manufacturing method for the active matrix organic electro luminescent display (ELD) device in which a storage capacitance of a storage capacitor is increased without reducing an aperture ratio and a number of needed masks is reduced.

Additional features and advantages of the invention will be set forth in the description. which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an active matrix organic electro luminescent display (ELD) device comprises a substrate, first and second active layers formed of polycrystalline silicon on the substrate, first source and drain regions and second source and drain regions, the first source and drain regions neighboring the first active layer and the second source and drain regions neighboring the second active layer, a gate insulating layer on the first and second active layers, first and second gate electrodes on the gate insulating layer, a first inter layer on the first and second gate electrodes, an anode electrode and a capacitor electrode on the first inter layer, a first passivation layer on the anode electrode and the capacitor electrode, a power line on the first passivation layer, first source and drain electrodes on the first passivation layer, the first source electrode being connected to the first source region and the first drain electrode being connected to the first drain region, second source and drain electrodes on the first passivation layer, the second source electrode being connected to the second source region, the power line and the capacitor electrode and the second drain electrode being connected to the second drain region and the anode electrode, and a second passivation layer on the first source and drain electrodes and the second source and drain electrodes, the second passivation layer having a bank that exposes the anode electrode. The capacitor electrode is overlapped with the second gate electrode and forms a storage capacitor together with the second gate electrode. The capacitor electrode is overlapped with the first drain region and forms a storage capacitor together with the first drain region. The capacitor electrode is formed of same material as the anode electrode. The anode electrode is formed one of indium tin oxide (ITO) and indium zinc oxide (IZO). The power line is formed of same material as the second source and drain electrodes. The active matrix organic electro luminescent display (ELD) device further comprise a second inter layer on the first inter layer. The second inter layer is formed of silicon nitride (SiNx).

A manufacturing method for an active matrix organic electro luminescent display (ELD) device comprises forming first and second semiconductor layers on a substrate with polycrystalline silicon, forming a gate insulating layer on the first and second semiconductor layers, forming first and second gate electrodes on the gate insulating layer, forming first source and drain regions and second source and drain regions by inputting ions into the first and second semiconductor layers using the first and second gate electrodes as a mask, forming a first inter layer on the first and second gate electrodes, forming an anode electrode on the first inter layer, forming a capacitor electrode on the first inter layer, forming a first passivation layer on the anode electrode and the capacitor electrode, the first passivation layer having a plurality of contact holes, forming a power line on the first passivation layer, forming first source and drain electrodes on the first passivation layer, the first source electrode being connected to the first source region and the first drain electrode being connected to the first drain region, forming second source and drain electrodes on the first passivation layer, the second source electrode being connected to the second source region, the power line and the capacitor electrode and the second drain electrode being connected to the second drain region and the anode electrode, and forming a second passivation layer on the first source and drain electrodes and the second source and drain electrodes, the second passivation layer having a bank that exposes the anode electrode. The capacitor electrode is overlapped with the second gate electrode and forms a storage capacitor together with the second gate electrode. The capacitor electrode is overlapped with the first drain region and forms a storage capacitor together with the first drain region. The capacitor electrode forming is performed in a same process for forming the anode electrode. The anode electrode is formed one of indium tin oxide (ITO) and indium zinc oxide (IZO). The power line forming is performed in a same process for forming the second source and drain electrodes. The manufacturing method for the active matrix organic electro luminescent display (ELD) device further comprise forming a second inter layer on the first inter layer. The second inter layer is formed of silicon nitride (SiNx).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiment of the present invention, which is illustrated in the accompanying drawings.

Figure 1:
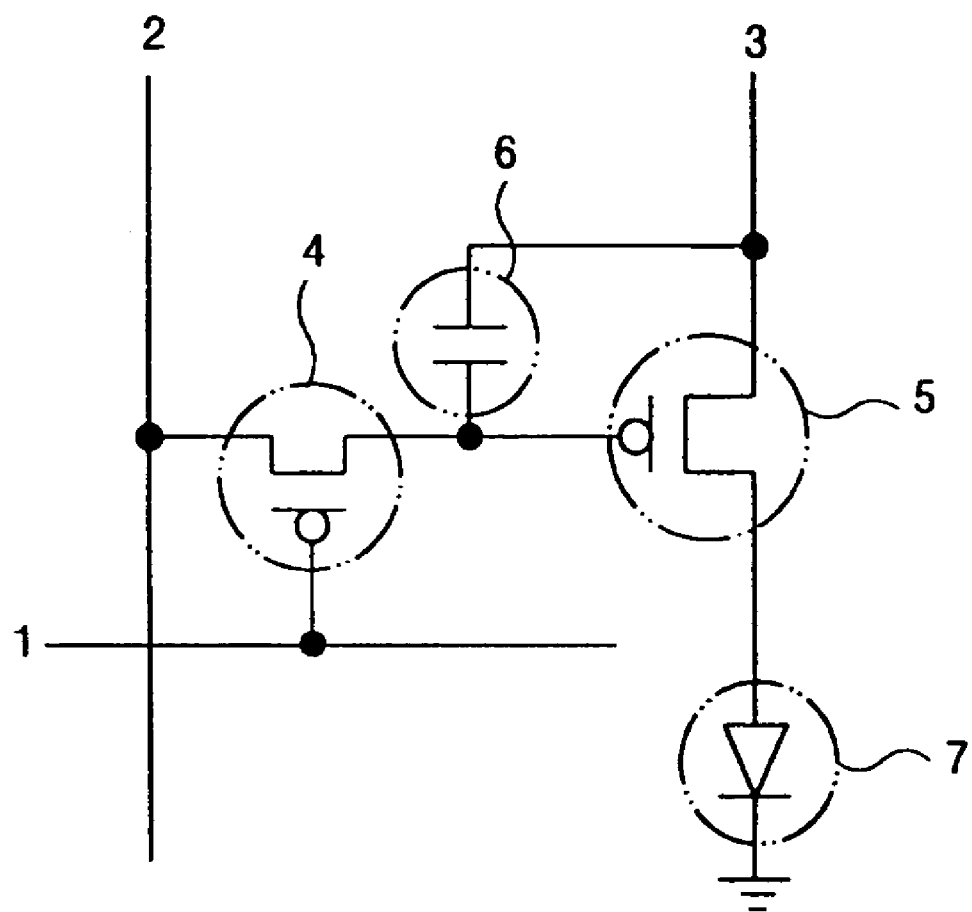
FIG. 1 is a circuit diagram illustrating a pixel of a related art active matrix organic electro luminescent display device.
Figure 2:
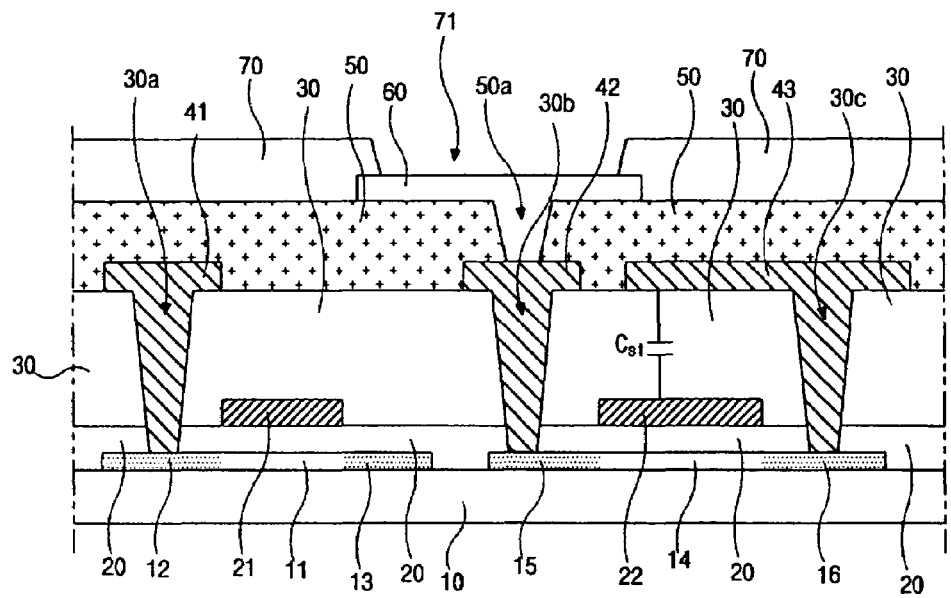
FIG. 2 is a cross-sectional view of the related art active matrix organic electro luminescent display device.
Figure 3A:
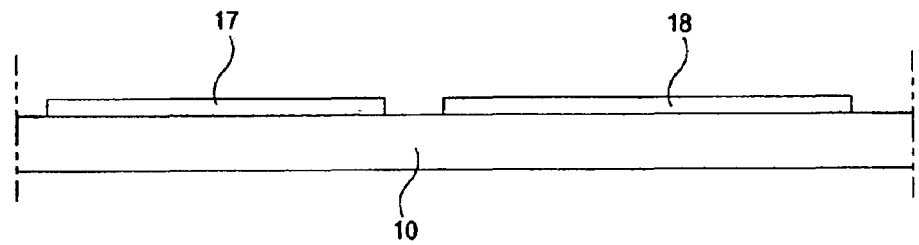
FIGS. 3A to 3G are cross-sectional views illustrating a fabricating sequence of the related art active matrix organic electro luminescent display device.
Figure 3B:
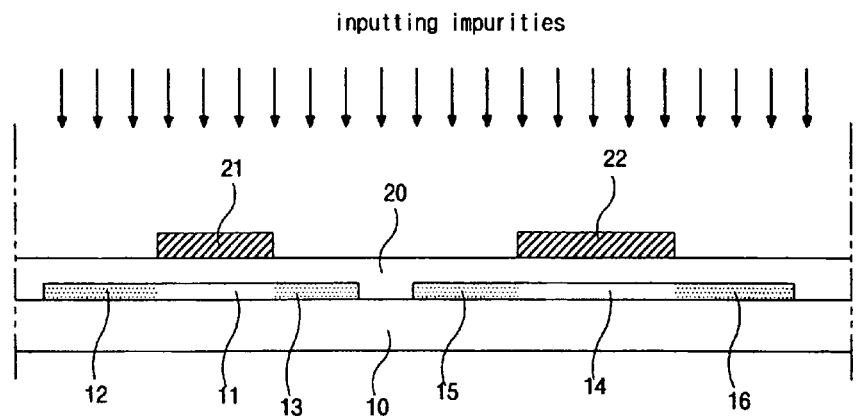
Figure 3C:
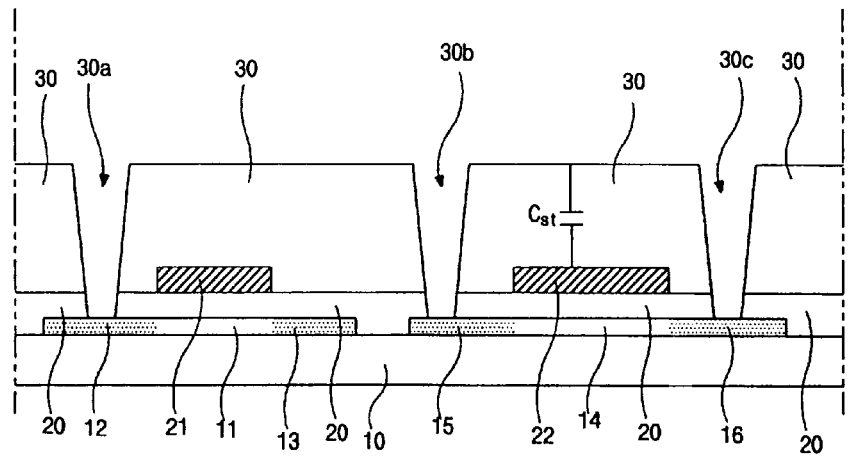
Figure 3D:
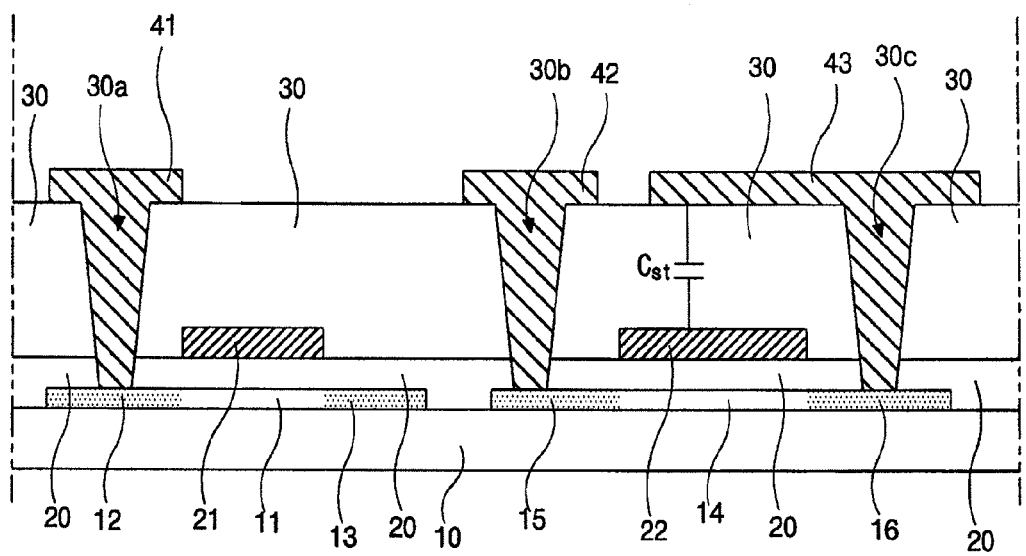
Figure 3E:
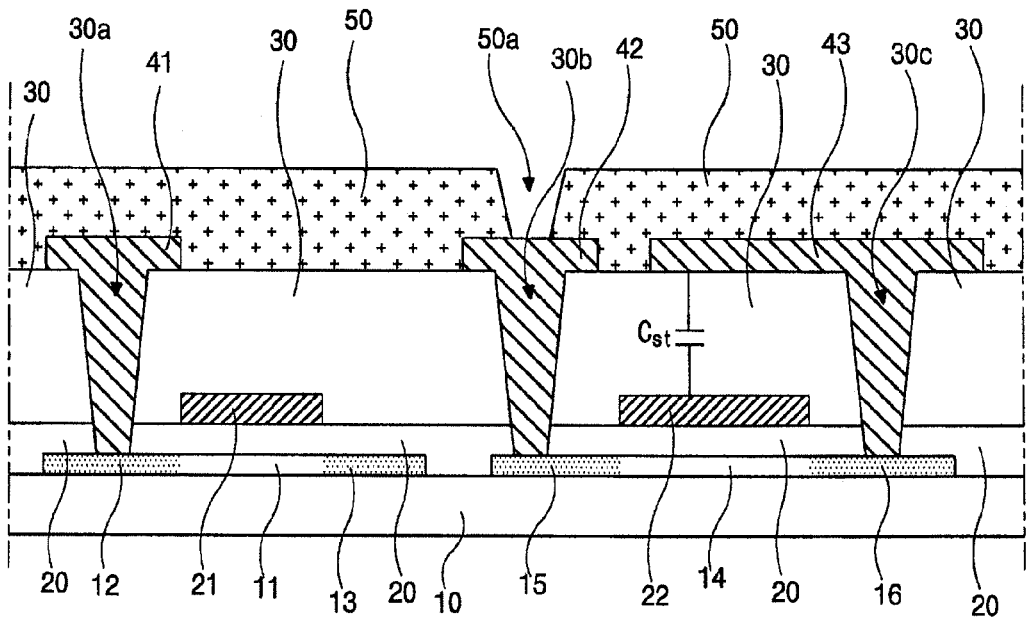
Figure 3F:
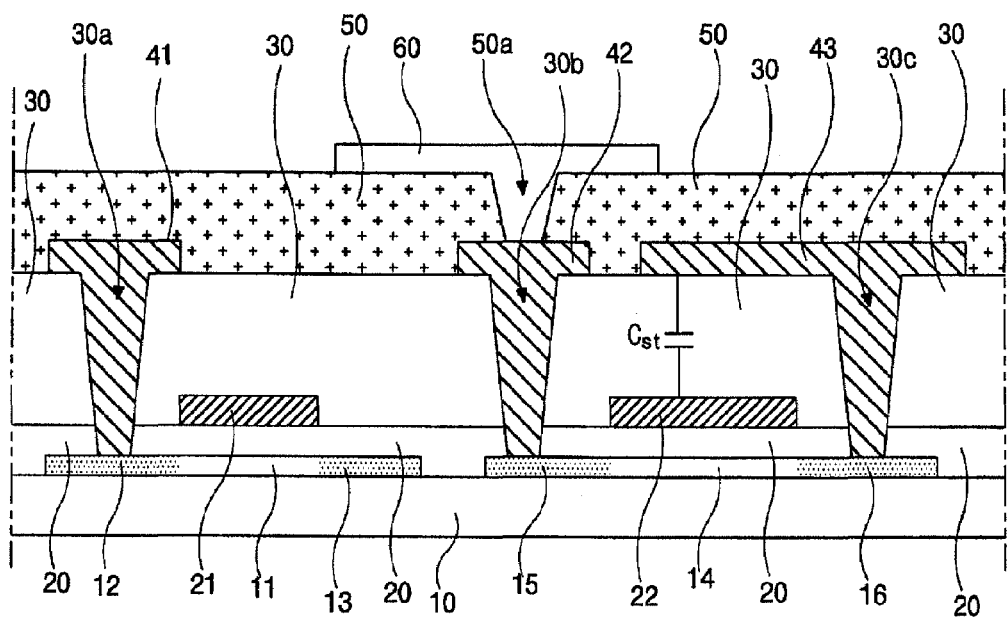
Figure 3G:
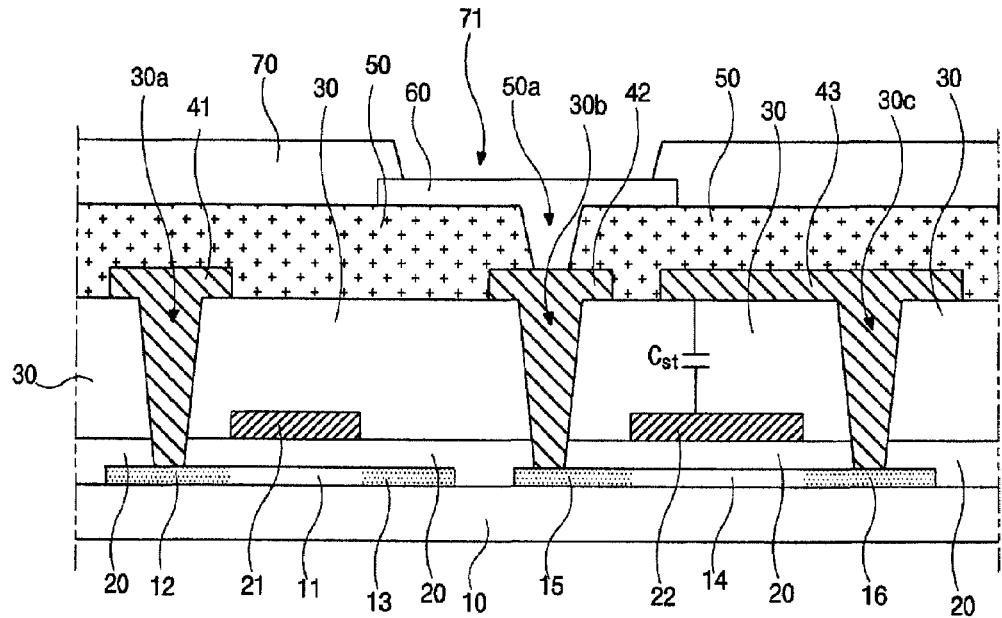
Figure 4:
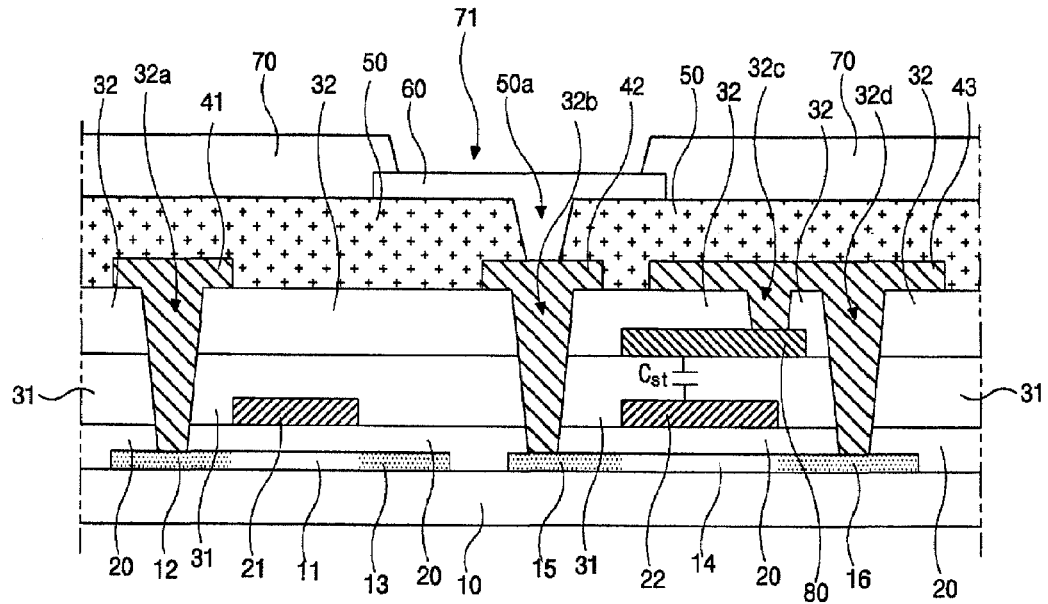
FIG. 4 is a cross-sectional view of other related art active matrix organic electro luminescent display device.
Figure 5:
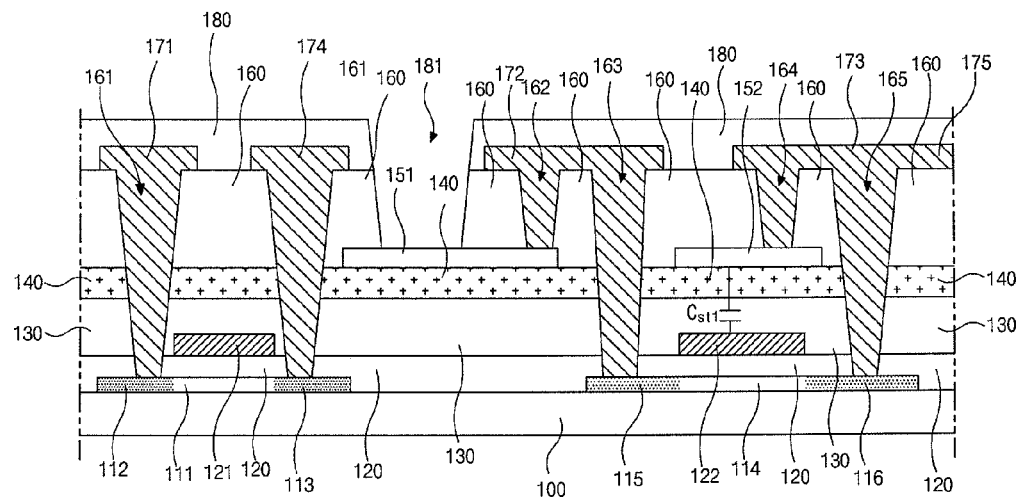
FIG. 5 is a cross-sectional view of an active matrix organic electro luminescent display device according to a first embodiment of the present invention.

FIG. 5 is a cross-sectional view of an active matrix organic electro luminescent display device according to a first embodiment of the present invention. In FIG. 5, a polycrystalline silicon layer 111, 112, 113, 114, 115 and 116 isformed on a transparent insulating substrate 100. The polycrystalline silicon layer 111, 112, 113, 114, 115 and 116 is divided into two regions that one has an active layer 111, a first source region 112 and a first drain region 113 and the other has an active layer 114, a second drain region 115 and a second source region 116. Impurities are doped onto the first source and drain regions 112 and 113 and the second source and drain regions 116 and 115. A gate insulating layer 120 is formed on the polycrystalline silicon layer 111, 112, 113, 114, 115 and 116. First and second gate electrodes 121 and 122 are formed on the gate insulating layer 120 respectively over the active area 111 and 114. The gate insulating layer 120 is formed one of silicon nitride (SiNx) and silicon oxide (SiO2) and has a thickness about 1,500 Å (angstrom). First and second inter layers 130 and 140 are sequentially formed on the first and second gate electrodes 121 and 122. Thicknesses of the first and second inter layers 130 and 140 are respectively about 2,500 Å (angstrom) and 1,500 Å (angstrom). The first inter layer 130 may be formed of silicon oxide (SiO2) and the second inter layer 140 may be formed of silicon nitride (SiNx). On the other hand, the second inter layer 140 may be omitted. An anode electrode 151 and a capacitor electrode 152 are formed of transparent conductive material such as indium tin oxide (ITO) on the second inter layer 140. A first passivation layer 160 is formed of material such as silicon oxide (SiO2) on the anode electrode 151 and the capacitor electrode 152. The first passivation layer 160 has first, second, third, fourth and fifth contact holes 161, 162, 163, 164 and 165. The first, third and fifth contact holes 161, 163 and 165 are formed all the way to the gate insulating layer 120. The first contact hole 161 exposes a portion of the fast source region 112, the second contact hole 162 the anode electrode 151, the third contact hole 163 the second drain region 115, the fourth contact hole 164 the capacitor electrode 152 and the fifth contact hole 165 the second source region 116. A first source electrode 171, a second drain electrode 172 and a second source electrode 173 are formed on the first passivation layer 160. In addition, a first drain electrode 174, which is connected to the first drain region 113, and a power line 175, which is connected to the second source electrode 173, are also formed on the first passivation layer 160. The second source electrode 173 may be extended from the power line 175 or may be formed of a portion of the power line 175. The first source electrode 171. is connected to the first source region 112 through the first contact hole 161. The second drain electrode 172 is connected to the anode electrode 151 and the second drain region 115 respectively through the second and third contact holes 162 and 163. The second source electrode 173 is connected to the capacitor electrode 152 and the second source region 116 through the fourth and fifth contact holes 164 and 165. The capacitor electrode 152 forms a storage capacitor Cst1 together with the second gate electrode 122. Though it is not shown in the figure, the second gate electrode 122 is electrically connected to the first drain region 113. The first gate electrode 121, the first source electrode 171 and the first drain electrode 174, form a switching thin film transistor, and the second gate electrode 122, the second source electrode 173 and the second drain electrode 172 form a driving thin film transistor. A second passivation layer 180 is formed on the first source electrode 171, the second drain electrode 172 and the second source electrode 173. A bank 181, which exposes anode electrode 151 is formed through the first and second passivation layers 160 and 180. Because the capacitor electrode 152 is formed of separate conductive material and connected to the power line 175 according to the first embodiment of the present invention, a thickness of the first and second inter layer 130 and 140, i.e., a dielectric substance of the storage capacitor Cst1 can be deduced. As state above, the second inter layer 140 may be formed of silicon nitride (SiNx) and the silicon nitride (SiNx) has a relatively high dielectric constant compared to the silicon oxide (SiO2). Accordingly, a storage capacitance of the storage capacitor Osti can be further increased. Therefore, a reduction of the storage capacitance of the storage capacitor Cst1 can be avoided even when an area of the storage capacitor Cst1 is reduced and thus an area of the anode electrode 151, which becomes a pixel electrode, is increased. An aperture ratio is subsequently increased as the area of the pixel electrode is increased. Because the capacitor electrode 152 is formed with same material as that of the anode electrode 151 and the source and drain electrodes 171, 172 and 173 are formed thereon, the number of manufacturing processes can be reduced according to the first embodiment of the present invention. A manufacturing sequence of the active matrix organic electro luminescent display (ELD) device according to the first embodiment will be described hereinafter with reference to FIGS. 6A to 6F.

Figure 6A:
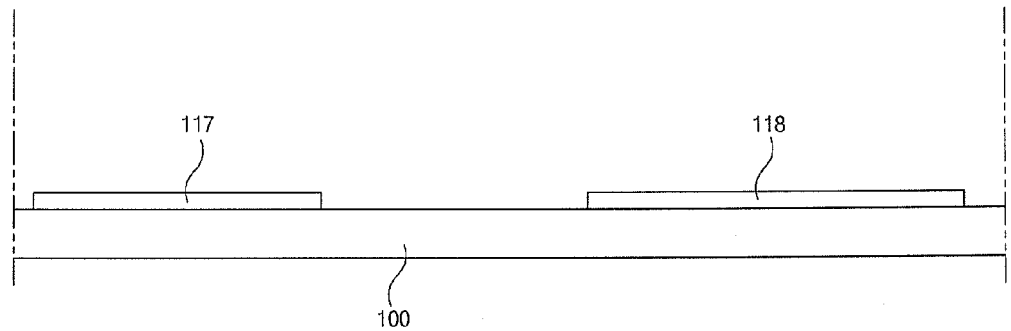
FIGS. 6A to 6F are cross-sectional views illustrating a fabricating sequence of the active matrix organic electro luminescent display device according to the first embodiment of the present invention.

In FIG. 6A, first and second semiconductor layer 117 and 118 are formed by forming polycrystalline silicon layer on the transparent substrate 100 and patterning it with a first mask. The polycrystalline silicon layer may be formed in many different ways and particularly be formed by depositing amorphous silicon and crystallizing it with a laser. A buffer layer (not shown) may further be formed between the substrate 100 and the semiconductor layers 117 and 118 with material such as silicon oxide ($SiO_2$) to prevent impurities from penetrating into the semiconductor layers 117 and 118 from the substrate 100.

Figure 6B:
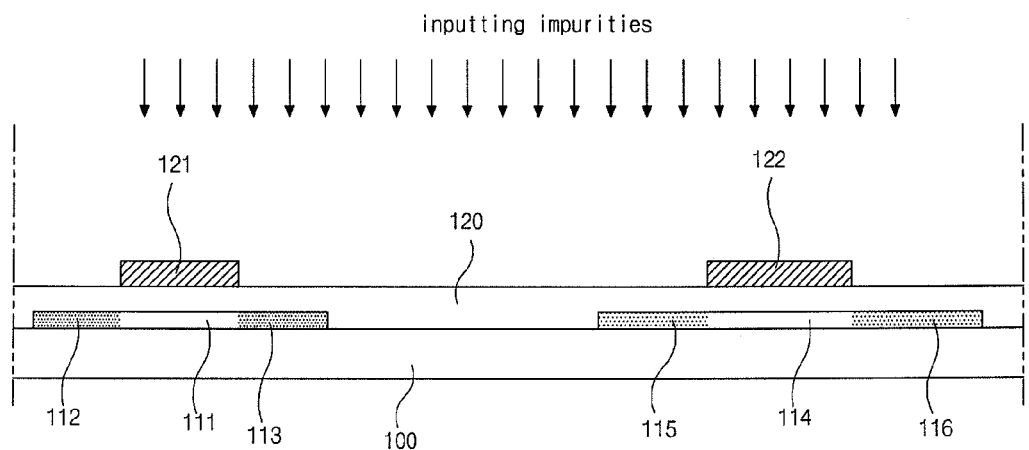

In FIG. 6B, the gate insulating layer 120 is formed on the semiconductor layers 117 and 118. The first and second gate electrodes 121 and 122 are formed by depositing material such as metal on the gate insulating layer 120 and patterning it with a second mask. The active layer 111 and 114 and the source and drain regions 112, 113, 115 and 116 are formed by inputting impurities into the semiconductor layers 117 and 118 of FIG. 6A using the first and second gate electrodes 121 and 122 as a mask. The gate insulating layer 120 may be formed one of silicon nitride (SiNx) and silicon oxide (SiO$_2$) and has a thickness about 1,500 Å (angstrom).

Figure 6C:
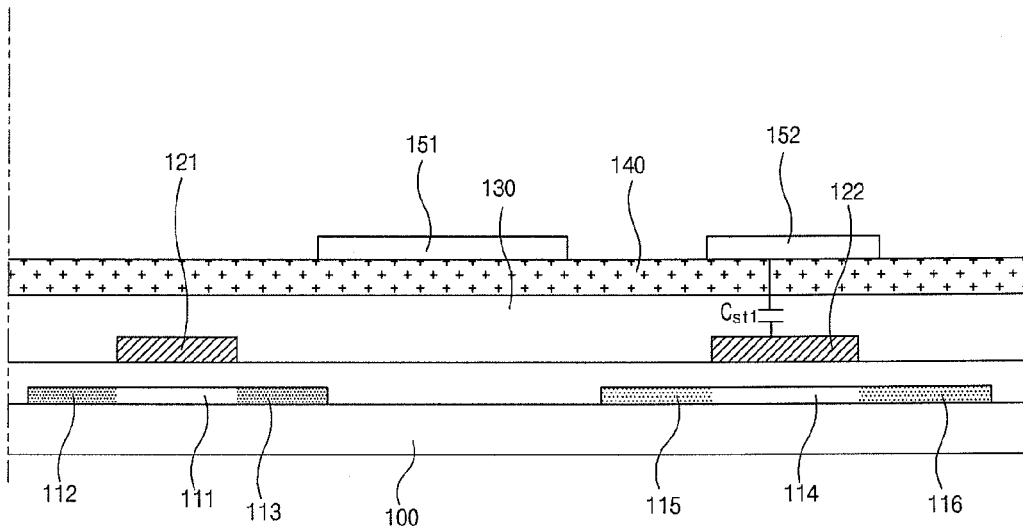

In FIG. 6C, the first and second inter layers 130 and 140 are sequentially formed on the first and second gate electrodes 121 and 122. The first inter layer 130 is formed of silicon oxide (SiO$_2$) and has a thickness about 2,500 Å (angstrom). The second inter layer 140 is formed of silicon nitride (SiNx) and has a thickness about 1,500 Å (angstrom). The anode electrode 151 and the capacitor electrode 152 are formed by depositing transparent conductive material on the second inter layer 140 and patterning it with a third mask. The capacitor electrode 152 and the second gate electrode 122 form the storage capacitor $C_{st1}$. A thickness of the storage capacitor $C_{st1}$ is the summation of the thickness of the first and second inter layer 130 and 140.

Figure 6D:
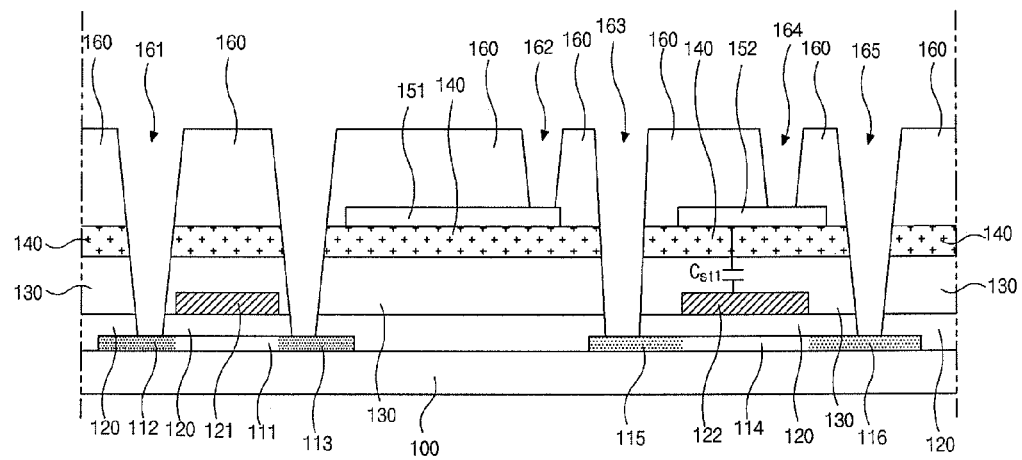

In FIG. 6D, the first passivation layer 160 is then formed on the anode electrode 151 and the capacitor electrode 152 by depositing material such as silicon oxide (SiO$_2$). A thickness of the first passivation layer 160 is about 4,000 Å (angstrom). The first, second, third, fourth and fifth contact holes 161, 162, 163, 164 and 165 are formed by pattering the gate insulating layer 120, the first and second inter layers 130 and 140 and the first passivation layer 160 with a fourth mask.

Figure 6E:
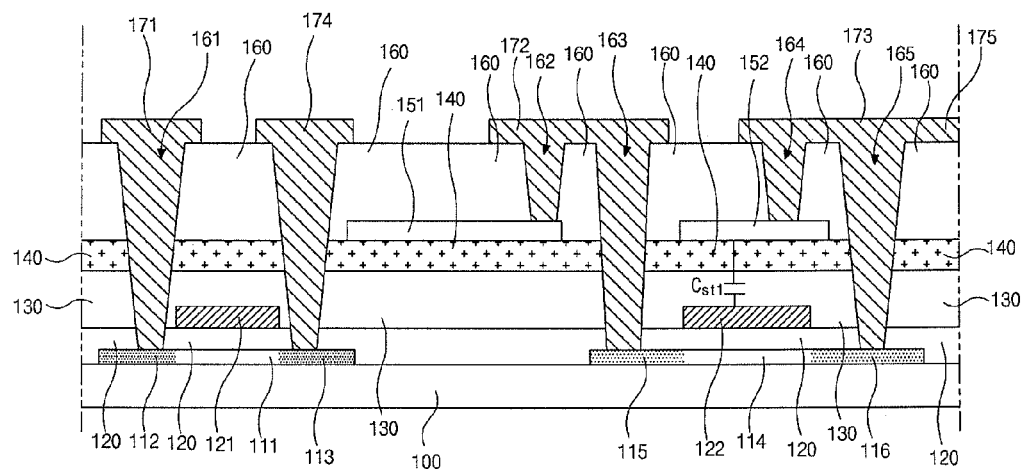

In FIG. 6E, the first source electrode 171, the second drain electrode 172 and the second source electrode 173 are formed by depositing conductive material such as metal on the first passivation layer 160 and patterning it with a fifth mask. Though it is not shown in the figure, a first drain electrode 174, which is connected to the first drain region 113, and a power line 175, which is connected to the second source electrode 173, are also formed on the first passivation layer 116. The second source electrode 173 may be extended from the power line 175 or may be formed of a portion of the power line 175. As stated above, the first source electrode 171 is connected to the first source region 112 through the first contact hole 161. The second drain electrode 172 is connected to the anode electrode 151 and the second drain region 115 respectively through the second and third contact holes 162 and 163. The second source electrode 173 is connected to the capacitor electrode 152 and the second source region 110 through the fourth and fifth contact holes 164 and 165.

Figure 6F:
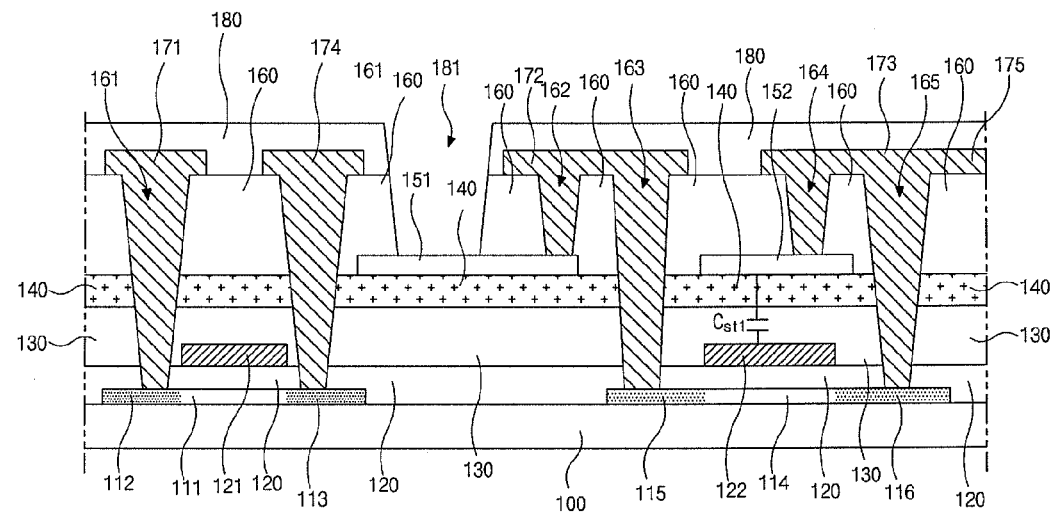

In FIG. 6F, the second passivation layer 180 is formed on the first. source electrode 171, the second drain electrode 172 and the second source electrode 173 by depositing material such as silicon oxide (SiO$_2$). The bank 181, which exposes the anode electrode 151, is formed by pattering the first and second passivation layers 160 and 180 with a sixth mask.

As stated above, six masks are used in the first embodiment of the present invention to manufacture the active matrix organic electro luminescent display (ELD) device and thus the manufacturing time and cost can be saved. The gate electrode of the driving thin film transistor, i.e., the second gate electrode 122, is used as an electrode of the storage capacitor $C_{st1}$ according to the first embodiment of the present invention but the drain region of the switching thin film transistor, i.e., the first drain region 113, which is electrically connected to the gate electrode of the driving thin film transistor, may be used as one of the electrode of the storage capacitor $C_{st1}$ according to a second embodiment of the present invention.

Figure 7:
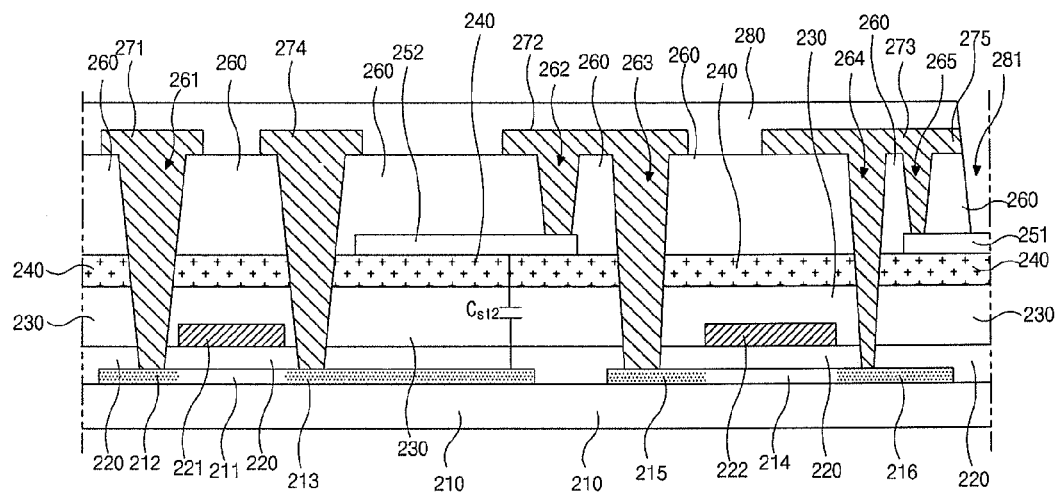
FIG. 7 is a cross-sectional view of an active matrix organic electro luminescent display device according to a second embodiment of the present invention.

A structure of an active matrix organic electro luminescent display (ELD) device and manufacturing method for the same will be described hereinafter with reference to attached figures. FIG. 7 is a cross-sectional view of an active matrix organic electro luminescent display device according to a second embodiment of the present invention. In FIG. 7, a polycrystalline silicon layer 211, 212, 213, 214, 215 and 216 is formed on a transparent insulating substrate 210. The polycrystalline silicon layer 211, 212, 213, 214, 215 and 216 comprises an active layer 211 and 214 and source and drain regions 212, 213, 215 and 216 into which impurities are doped. A gate insulating layer 220 is formed on the polycrystalline silicon layer 211, 212, 213, 214, 215 and 216. First and second gate electrodes 221 and 222 are then formed on the gate insulating layer 220 over the active layer 211 and 214. The gate insulating layer 220 may be for ed one of silicon nitride (SiNx) and silicon oxide (SiO$_2$) and has a thickness about 1,500 Å (angstrom). First and second inter layers 230 and 240 are then formed on the first and second gate electrodes 221 and 222. The first inter layer 230 has thickness about 2,500 Å (angstrom) and the second inter layer 240 about 1,500 Å (angstrom). The first inter layer 230 may be formed of silicon oxide (SiO$_2$), and the second inter layer 240 may be formed of silicon nitride (SiNx) or may be omitted. An anode electrode 251 and a capacitor electrode 252 are formed of transparent conductive material such as indium tin oxide (ITO) on the second inter layer 240. A first passivation layer 260 is formed of silicon oxide (SiO$_2$) on the anode electrode 251 and the capacitor electrode 252. First, second, third, fourth and fifth contact holes 261, 262, 263, 264 and 265 are formed by pattering the gate insulating layer 220, the first and second inter layer 230 and 240 and the first passivation layer 260. The first, third and fourth contact holes 261, 263 and 264 are formed to the gate insulating layer 220. The first contact hole 261 exposes a partial first source region 212, the second contact hole 262 the capacitor electrode 252, the third contact hole 263 a second source region 215, the fourth contact hole 264 a second drain region 216 and the fifth contact hole 265 the anode electrode 252. A first source electrode 271, a second source electrode 272 and a second drain electrode 273 are formed on the first passivation layer 260. Though it is not shown in the figures, a first drain electrode 274 and a power line 275 are also formed on the first passivation layer 260. The first drain electrode 274 is connected to the first drain region 213 and the power line 275 is connected to the second source electrode 272. The second source electrode 272 may be extended from the power line 275 or may be a portion of the power line 275. The first source electrode 271 is connected to the first source region 212 through the first contact hole 261. The second source electrode 272 is connected to the capacitor electrode 252 and the second source region 215 respectively through. the second and third contact holes 262 and 263. The second drain electrode 273 is connected to the second drain region 216 and the anode electrode 251 respectively through the fourth and fifth contact holes 264 and 265. The capacitor electrode 252 forms a storage capacitor $C_{st2}$ by being overlapped with the first drain region 213. Though it is not shown in the figure, the second gate electrode 222 is a electrically connected to the first drain region 213. The first gate electrode 221, the first source electrode 271 and the first drain electrode 274 form a switching thin film transistor, and the second gate electrode 222 and the second source and drain electrodes 272 and 273 form a driving thin film transistor. A second passivation layer 280 is formed on the first source electrode 271 and the second source and drain electrodes 272 and 273. A bank 281 is formed through the first and second passivation layers 260 and 280 to expose the anode electrode 251. As stated above, the first drain region 213, i.e., a drain region of the switching thin film transistor, and the capacitor electrode 252 form the storage capacitor $C_{st2}$. A dielectric substance of the storage capacitor comprises the gate insulating layer 220 and the first and second inter layers 230 and 240. Because the gate insulating layer 220 is relatively thin, an increase of the thickness of the dielectric substance is not so big. Besides, because the capacitor electrode 252 is formed with separate conductive material, the thickness of the first and second inter layers 230 and 240 can be formed thin. In addition, because the second inter layer 240 formed of silicon nitride (SiNx), a storage capacitance of the storage capacitor $C_{st2}$ can be increased and an aperture ratio can be increased by increasing an area of the anode electrode 251.

Figure 8A:
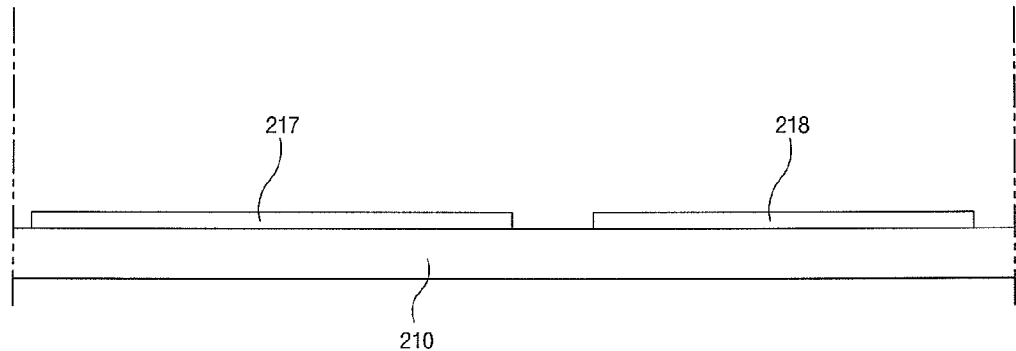
FIGS. 8A to 8F are cross-sectional views illustrating a fabricating sequence of the active matrix organic electro luminescent display device according to the second. embodiment of the present invention.

FIGS. 8A to 8F are cross-sectional views illustrating a fabricating sequence of the active matrix organic electro luminescent display device according to the second embodiment of the present invention. In FIG. 8A, first and second semiconductor layers 217 and 218 are formed by forming polycrystalline silicon on the transparent insulating substrate 210 and patterning it with a first mask. The polycrystalline silicon forming may be executed in many different ways and particularly it may be executed by depositing amorphous silicon and crystallizing it with a laser. A buffer layer (not shown) may further be formed between the substrate 210 and the semiconductor layers 217 and 218 with material such as silicon oxide ($SiO_2$).

Figure 8B:
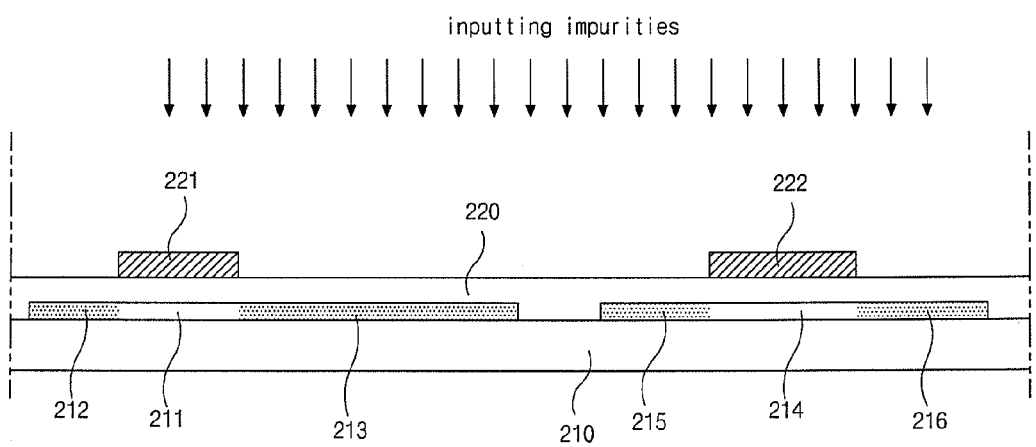

In FIG. 8B, the gate insulating layer 220 is formed on the first and second semiconductor layers 217 and 218. The first and second gate electrodes 221 and 222 are sequentially formed by depositing material such as metal on the gate insulating layer 220 and patterning it with a second mask. The active layer 211 and 214, the first source and drain regions 212 and 213 and the second source and drain regions 215 and 216 are formed by inputting impurities into the semiconductor layers 217 and 218 of FIG. 8A using the first and second gate electrodes 221 and 222. The gate insulating layer 220 may be formed of material such as silicon oxide ($SiO_2$) and has a thickness about 1,500 Å (angstrom).

Figure 8C:
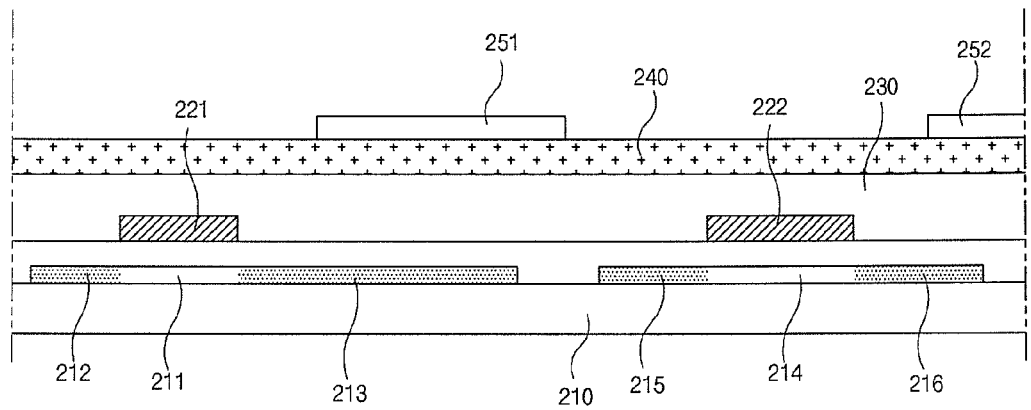

In FIG. 8C, the first inter layer 230 is formed on the first and second gate electrodes 221 and 222 with silicon oxide ($SiO_2$) and a thickness of the first inter layer 230 is about 2,500 Å (angstrom). The second inter layer 240 is sequentially formed on the first inter layer 230 with silicon nitride (SiNx) and a thickness of the second inter layer 240 is about 1,500 Å (angstrom). The anode electrode 251 and the capacitor electrode 252 are formed by depositing transparent conductive materials such as indium tin oxide (ITO) and patterning it with a third mask. The capacitor electrode 252 is overlapped with the first drain region 213 and forms the storage capacitor $C_{st2}$ together with the first drain region 213. A thickness of the dielectric substance of the storage capacitor $C_{st2}$ is a sum of the thickness of the gate insulating layer 220, the first inter layer 230 and the second inter layer 240.

Figure 8D:
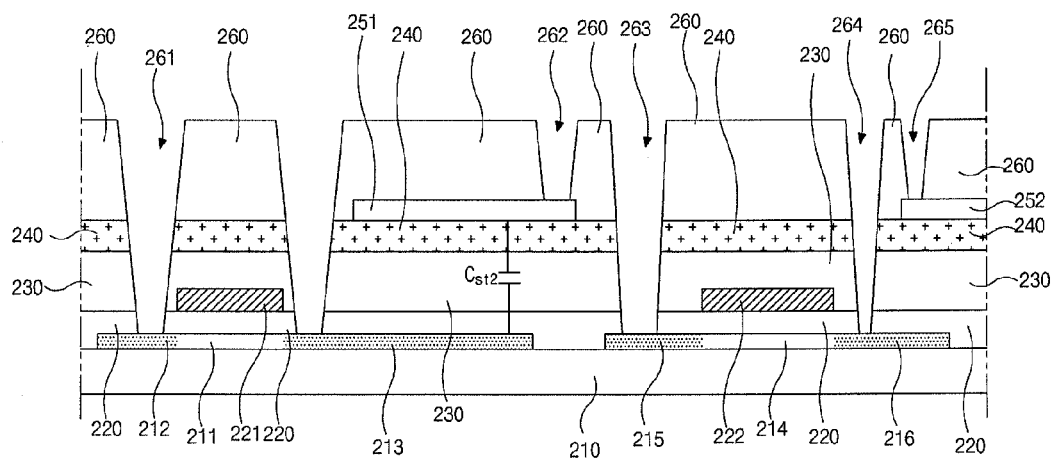

In FIG. 8D, the first passivation layer 260 is formed by depositing material such as silicon oxide ($SiO_2$) on the anode electrode 251 and the capacitor electrode 252 and a thickness of the passivation layer 260 is about 4,000 Å (angstrom). The first, third and fourth contact holes 261, 263 and 264 are formed through the gate insulating layer 220, the first and second inter layers 230 and 240 and the first passivation layer 260 by a photolithographic masking technique with a fourth mask. The second and fifth contact holes 262 and 265 are formed through the first passivation layer 260 in a same way and at the same time as the first, third and fourth contact holes 261, 263 and 264.

Figure 8E:
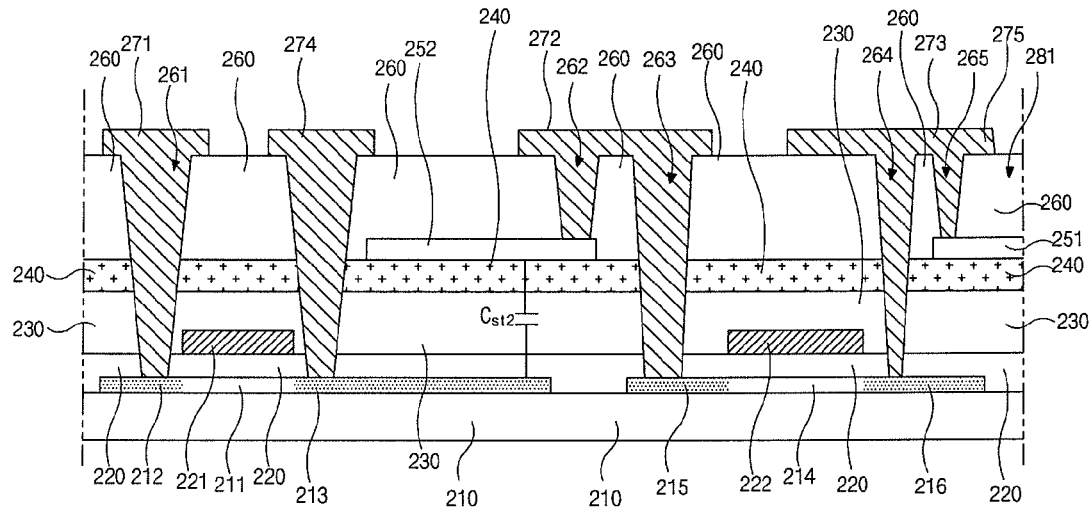

In FIG. 8E, the first source electrode 271, the second source electrode 272 and the second drain electrode 273 are formed by depositing material such as metal on the first passivation layer 260 and patterning it with a fifth mask. As stated before, the first drain electrode 274 and the power line 275 are also formed on the first passivation layer 260. The first drain electrode 274 is connected to the first drain region 213 and the power line 275 is connected to the second source electrode 272. The second source electrode 272 may be extended from the power line 275 or may be a portion of the power line 275. The first drain electrode 274 is connected to the first drain region 213 and the power line 275 is connected to the second source electrode 272. The second source electrode 272 may be extended from the power line 275 or may be a portion of the power line 275. The first source electrode 271, is connected to the first source region 212 through the first contact hole 261. The second source electrode 272 is connected to the capacitor electrode 252 and the second source region 215 respectively through the second and third contact holes 262 and 263. The second drain electrode 273 is connected to the second drain region 215 and the anode electrode 251 respectively through the fourth and fifth contact holes 264 and 265.

Figure 8F:
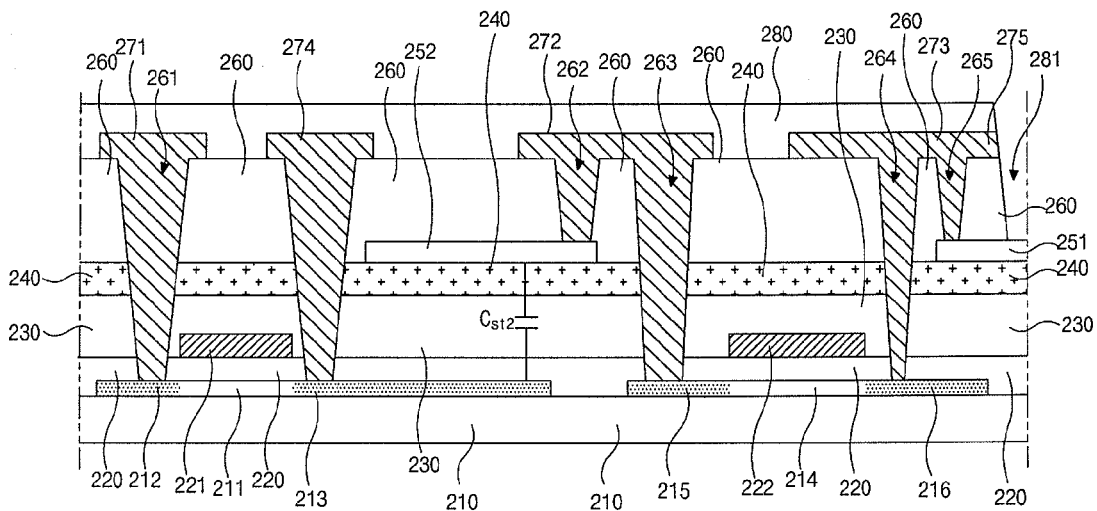

In FIG. 8F, the second passivation layer 280 is formed by depositing material such. as silicon oxide ($SiO_2$) on the first source electrode 271 and the second source and drain electrodes 272 and 273. The bank 281 is then formed by pattering the first and second passivation layers 260 and 280 with a sixth mask to expose the anode electrode 251.

As stated above, because the capacitor electrode of the storage capacitor is formed with separate conductive material and connected to the power line according to the present invention, the thickness of the dielectric substance may be controlled to be thin. In addition, the storage capacitance of the storage capacitor can further be increased by forming the dielectric substance with silicon nitride (SiNx), which has a high dielectric constant. Accordingly, even if an area of the storage capacitor is reduced, a decrease of the storage capacitance can be prevented and the aperture ratio can be increased by increasing an area of the anode electrode. Furthermore, a manufacturing process and cost can be decreased by forming the capacitor electrode with same material as the anode electrode and forming the source and drain electrodes thereon.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A manufacturing method for a substrate assembly of an active matrix organic electro luminescent display (ELD) device, comprising:

forming first and second semiconductor layers on a substrate with polycrystalline silicon;

forming a gate insulating layer on the first and second semiconductor layers;

forming first and second gate electrodes on the gate insulating layer;

forming first source and drain regions and second source and drain regions by inputting ions into the first and second semiconductor layer using the first and second gate electrodes as a mask;

forming a first inter layer on the first and second gate electrodes;

forming an anode electrode on the first inter layer;

forming a capacitor electrode on the first inter layer;

forming a first passivation layer on the anode electrode and the capacitor electrode, the first passivation layer having a plurality of contact holes;

forming a power line on the first passivation layer;

forming first source and drain electrodes on the first passivation layer, the first source electrode being connected to the first source region and the first drain electrode being connected to the first drain region;

forming second source and drain electrodes on the first passivation layer, the second source electrode being connected to the second source region, the power line and the capacitor electrode, and the second drain electrode being connected to the second drain region and the anode electrode; and forming a second passivation layer on the first source and drain electrodes and the second source and drain electrodes, the second passivation layer having a bank that exposes the anode electrode.

2. The method according to claim 1, wherein the capacitor electrode is overlapped with the second gate electrode and forms a storage capacitor together with the second gate electrode.

3. The method according to claim 2 wherein the capacitor electrode forming is performed in a same process as that of the anode electrode.

4. The method according to claim 3, wherein the anode electrode is formed one of indium tin oxide (ITO) and indium zinc oxide (IZO).

5. The method according to claim 2 wherein, the power line forming is performed in a same process as that of the second source and drain electrodes.

6. The method according to claim 2, further comprising forming a second inter layer on the first inter layer.

7. The method according to claim 6, wherein the second inter layer is formed of silicon nitride (SiNx).

8. The method according to claim 1, wherein the capacitor electrode is overlapped with the first drain region and forms a storage capacitor together with the first drain region.

9. The method according to claim 8, wherein the capacitor electrode forming is performed in a same process as that of the anode electrode.

10. The method according to claim 9, wherein the anode electrode is formed one of indium tin oxide (ITO) and indium zinc oxide (IZO).

11. The method according to claim 8, wherein the power line forming is performed in a same process as that of the second source and drain electrodes.

12. The method according to claim 8, further comprising forming a second inter layer on the first inter layer.

13. The method according to claim 12, wherein the second inter layer is formed of silicon nitride (SiNx).

14. A manufacturing method for an active matrix organic electro luminescent display device, comprising:
    forming first and second polycrystalline semiconductor layers on a substrate;
    forming a gate insulating layer on the first and second polycrystalline semiconductor layers;
    forming first and second gate electrodes on the gate insulating layer;
    inputting ions into the first and second polycrystalline semiconductor layers using the first and second gate electrodes as a mask so that each of the polycrystalline semiconductor layers includes an active layer, a source region and a drain region;
    forming a first inter layer on the first and second gate electrodes;
    forming an anode electrode on the first inter layer;
    forming a capacitor electrode on the first inter layer, wherein the capacitor electrode is formed of the same material as the anode electrode to form a storage capacitor with the second gate electrode;
    forming first and second contact holes, wherein the first and second contact holes expose the source region and drain regions of the second polycrystalline semiconductor layer, respectively, through the gate insulating layer and the first inter layer;
    forming a source electrode and a drain electrode on the first inter layer, the source electrode and the drain electrode being connected to the source region and the drain region of the second polycrystalline semiconductor layer, respectively, wherein a portion of the drain electrode contacts the anode electrode.

15. The method according to the claim 14, wherein a bottom surface of the portion of the drain electrode directly contacts the anode electrode.

* * * * *